(12) United States Patent
Merelle et al.

(10) Patent No.: US 8,283,231 B2
(45) Date of Patent: Oct. 9, 2012

(54) FINFET DRIVE STRENGTH MODIFICATION

(75) Inventors: Thomas Merelle, Leuven (BE); Gerben Doornbos, Leuven (BE); Robert James Pascoe Lander, Leuven (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 454 days.

(21) Appl. No.: 12/483,133

(22) Filed: Jun. 11, 2009

(65) Prior Publication Data
US 2010/0006945 A1 Jan. 14, 2010

(30) Foreign Application Priority Data
Jun. 11, 2008 (EP) .................................... 08104375

(51) Int. Cl.
*H01L 27/088* (2006.01)
*H01L 21/336* (2006.01)

(52) U.S. Cl. ........ 438/276; 438/301; 438/306; 257/391; 257/392; 257/500; 257/550

(58) Field of Classification Search .................. 257/335, 257/341, 344, 345, 348, 368, 404, 408, 486
See application file for complete search history.

(56) References Cited

U.S. PATENT DOCUMENTS

| | | | |
|---|---|---|---|
| 6,706,571 B1 * | 3/2004 | Yu et al. .......................... | 438/157 |
| 6,858,478 B2 | 2/2005 | Chau et al. | |
| 7,120,046 B1 * | 10/2006 | Forbes ........................... | 365/149 |
| 7,190,050 B2 | 3/2007 | King et al. | |
| 7,214,991 B2 * | 5/2007 | Yeo et al. ....................... | 257/401 |
| 7,247,887 B2 | 7/2007 | King et al. | |
| 7,265,008 B2 * | 9/2007 | King et al. ..................... | 438/197 |
| 7,329,937 B2 * | 2/2008 | Nowak ........................... | 257/486 |
| 7,508,031 B2 | 3/2009 | Liu et al. | |
| 7,528,465 B2 | 5/2009 | King et al. | |
| 7,605,449 B2 | 10/2009 | Liu et al. | |
| 2005/0153490 A1 | 7/2005 | Yoon et al. | |
| 2005/0285204 A1 * | 12/2005 | Kim et al. ...................... | 257/368 |
| 2007/0120156 A1 | 5/2007 | Liu et al. | |
| 2007/0122953 A1 * | 5/2007 | Liu et al. ....................... | 438/187 |
| 2007/0122954 A1 | 5/2007 | Liu et al. | |
| 2007/0128782 A1 | 6/2007 | Liu et al. | |
| 2007/0132053 A1 | 6/2007 | King et al. | |

(Continued)

OTHER PUBLICATIONS

Bartlomiej Jan Pawlak, et al., U.S. Appl. No. 12/569,689, "Method of Fabricating Finfet Device," filed Sep. 29, 2009, 21 pages.

(Continued)

*Primary Examiner* — Matthew W Such
*Assistant Examiner* — David Spalla
(74) *Attorney, Agent, or Firm* — Haynes and Boone, LLP

(57) ABSTRACT

A method and circuit in which the drive strength of a FinFET transistor can be selectively modified, and in particular can be selectively reduced, by omitting the LDD extension formation in the source and/or in the drain of the FinFET.

One application of this approach is to enable differentiation of the drive strengths of transistors in an integrated circuit by applying the technique to some, but not all, of the transistors in the integrated circuit. In particular in a SRAM cell formed from FinFET transistors the application of the technique to the pass-gate transistors, which leads to a reduction of the drive strength of the pass-gate transistors relative to the drive strength of the pull-up and pull-down transistors, results in improved SRAM cell performance.

16 Claims, 14 Drawing Sheets

U.S. PATENT DOCUMENTS

| | | | |
|---|---|---|---|
| 2007/0228372 | A1 | 10/2007 | Yang et al. |
| 2008/0258228 | A1* | 10/2008 | Chuang et al. ............. 257/369 |
| 2008/0263492 | A1 | 10/2008 | Chuang et al. |
| 2008/0290470 | A1 | 11/2008 | King et al. |
| 2008/0296632 | A1 | 12/2008 | Moroz et al. |
| 2009/0035909 | A1 | 2/2009 | Chang et al. |
| 2009/0181477 | A1 | 7/2009 | King et al. |
| 2010/0006974 | A1 | 1/2010 | Xu et al. |
| 2010/0052059 | A1 | 3/2010 | Lee |
| 2010/0183961 | A1 | 7/2010 | Shieh et al. |
| 2010/0203734 | A1 | 8/2010 | Shieh et al. |
| 2010/0264468 | A1 | 10/2010 | Xu |
| 2011/0019488 | A1* | 1/2011 | Bawedin et al. ....... 365/189.011 |

OTHER PUBLICATIONS

Hsien-Hsin Lin, et al., U.S. Appl. No. 12/703,918, "Method for Fabricating a Finfet Device," filed Feb. 11, 2010, 40 pages.

Chien-Chang Su, et al., U.S. Appl. No. 12/644,869, "Method for Incorporating Impurity Element in EPI Silicon Process," filed Dec. 22, 2009, 21 pages.

Tsung-Lin Lee, et al., U.S. Appl. No. 12/622,038, "Sacrificial Offset Protection Film for a Finfet Device," filed Nov. 19, 2009, 56 pages.

Jeff J. Xu, et al., U.S. Appl. No. 12/784,207, "Method of Forming EPI Film in Substrate Trench," filed May 20, 2010, 33 pages.

Tian-Choy, et al., U.S. Appl. No. 12/756,552, "Hybrid Gate Process for Fabricating Finfet Device," filed Apr. 8, 2010, 38 pages.

Ming-Lung Cheng, et al. U.S. Appl. No. 12/780,124, "Method and Apparatus for Enhancing Channel Strain," filed May 14, 2010, 35 pages.

Jhon Jhy Liaw, U.S. Appl. No. 12/823,907, "Cell Structure for Dual-Port SRAM," filed Jun. 25, 2010, 46 pages.

Jhon Jhy Liaw, U.S. Appl. No. 12/827,406, "Rom Cell Circuit for Finfet Devices," filed Jun. 30, 2010, 32 pages.

Jhon Jhy Liaw, U.S. Appl. No. 12/823,860, "Structure and Method for SRAM Cell Circuit," filed Jun. 25, 2010, 37 pages.

Jhon Jhy Liaw, et al., U.S. Appl. No. 12/827,690, "Layout for Multiple-Fin SRAM Cell," filed Jun. 30, 2010, 35 pages.

Jeng-Jung Shen, et al., U.S. Appl. No. 12/780,060, "Automatic Layout Conversion for Finfet Device," filed May 14, 2010, 29 pages.

Jeng-Jung Shen, et al., U.S. Appl. No. 12/780,426, "Finfet Boundary Optimization," filed May 14, 2010, 28 pages.

Yu-Lien Huang, et al., U.S. Appl. No. 12/840,830, "High Surface Dopant Concentration Semiconductor Device and Method of Fabricating," filed Jul. 21, 2010, 21 pages.

Peng-Soon Lim, et al., U.S. Appl. No. 12/827,512, "Gate Structures and Method of Fabricating Same," filed Jun. 30, 2010, 41 pages.

Tsu-Hsiu Perng, et al., U.S. Appl. No. 12/837,093, "Fin-Like Field Effect Transistor (Finfet) Device and Method of Manufacturing Same," filed Jul. 15, 2010, 30 pages.

Clement Hsingjen Wann, et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor on Fin-Like Field Effect Transistor (Finfet) Structure," filed Aug. 30, 2010, 30 pages.

Jeff J. Xu, et al, U.S. Appl. No. 12/906,820, "Fin-Like Field Effect Transistor (Finfet) Device and Method of Manufacturing Same," filed Oct. 18, 2010, 55 pages.

Jeff J. Csu, et al, U.S. Appl. No. 12/917,902, "Fin-Like Field Effect Transistor (FINFET) Device and Method of Manufacturing Same," filed Nov. 2, 2010, 61 pages.

Mark van Dal, U.S. Appl. No. 12/900,895, "Method of Fabricating a Semiconductor Device Having an Epitaxly Region," filed Oct. 8, 2010, 21 pages.

Hsin-Chih Chen, et al, U.S. Appl. No. 12/907,272, "Multi-Fin Device by Self-Aligned Castle Fin Formation," filed Oct. 19, 2010, 34 pages.

Chien-Hsun Wang, et al, U.S. Appl. No. 12/952,376, "Method for Adjusting Fin Width in Integrated Circuitry," filed Nov. 23, 2010, 27 pages.

Chien-Shun Wang, et al, U.S. Appl. No. 12/949,881, "Method for Forming Metrology Structures From Fins in Integrated Circuitry," filed Nov. 19, 2010, 16 pages.

Chien-Hsun Wang, et al, U.S. Appl. No. 12/953,148, "Device and Method for Forming Fins in Integrated Circuitry," filed Nov. 23, 2010, 39 pages.

T. Hoffmann et al., GIDL (Gate-Induced Drain Leakage) and Parasitic Schottky barrier Leakage Elimination in aggressively scaled HfO2/TiN FinFET devices, Electron Devices Meeting, 2005 IEDM Technical Digest. IEEE International Dec. 5, 2005, Piscataway, NJ, USA.

H. Kawasaki et al., Embedded Bulk FinFET SRAM cell Technology with planar FET peripheral circuit for hp32nm node and beyond, Symposium on VLSI Technology digest of Technical papers, 2006.

Z. Guo et al., FinFET-based SRAM Design, Proceedings of the 2005 International Symposium on Low Power Electronics and Design (ISPLED'05), pp. 2-7, 2005.

* cited by examiner

FINFET DRIVE STRENGTH MODIFICATION

CROSS REFERENCE

This application claims priority to European patent application number 08104375.4, filed Jun. 11, 2008, the disclosure of which is incorporated herein by reference.

BACKGROUND

The present invention relates to the selective modification of the drive strength of a finFET (Fin Field Effect Transistor). In particular the invention provides methods for forming fin-FETs with a selectively modified drive strength and to circuits resulting from the application of those methods to the fabrication of integrated circuits. The present invention is particularly suited to, but not limited to, use in a Static Random Access Memory (SRAM) cell.

CMOS (Complementary Metal Oxide Semi-conductor) technology is widely used today in integrated circuits used in, for example, microprocessors, microcontrollers, memory circuits and other digital logic circuits, as well as in a wide variety of analog circuits. CMOS technology relies on MOSFETs (Metal Oxide Semiconductor Field Effect Transistors) to amplify or to switch signals.

It is desirable to be able to differentiate the drive strengths of transistors within a CMOS circuit. For example one area in which it has been found to be advantageous to differentiate the drive strengths of transistors is within a Static Random Access Memory (SRAM) cell. A typical SRAM cell circuit with 6 transistors (6-T SRAM cell) is shown in FIG. 1, and a typical implementation of such a cell in conventional planar CMOS technology is shown in FIG. 2.

The exemplary 6-T SRAM cell shown in FIG. 1 comprises first and second cross-coupled inverters 2, 4 each inverter 2, 4 comprising a respective P-MOS Pull-Up (PU) transistor 6,8 and a N-MOS Pull-down (PD) transistor 10,12 coupled in series between the power source Vdd and ground Gnd. A first respective N-MOS Pass-gate (PG) transistor 14 is coupled between a bit-line 16 and an internal node 18 connecting the first pull-up transistor 6 and the first pull-down transistor 10. A second respective N-MOS pass-gate transistor 20 is coupled between an inverted bit-line 22 and an internal node 24 connecting the second pull-up transistor 8 and the second pull-down transistor 12. As will be apparent to a skilled person, corresponding inverted values are held by the internal nodes 18, 24.

The exemplary 6-T SRAM cell stores one bit and has two stable states, in which either internal node 18 or internal node 24 are asserted, which are used to denote a 1 or 0 for the bit. Access to the exemplary 6-T SRAM cell during both a read operation and a write operation is enabled by the word line WL, which turns on the first and second pass-gate transistors 14, 20 thus coupling the internal nodes 18, 24 to the bit lines 16, 22 respectively. For example, during a read operation, the bit lines 16 and 22 are both pre-charged to logic 1, before asserting the word line WL to turn on first and second pass-gate transistors 14, 20. Thereafter, the bit line corresponding to whichever of the internal node 18 or 24 started at logic 0 will discharge into the cell via the respective pass-gate transistor 14, 20 and the respective pull-down transistor 10,12. A detailed discussion of the read and write operation of a 6-T SRAM cell will be omitted since a skilled person will be familiar with the layout and operation of 6-T SRAM cell.

As is well known, the performance of a SRAM cell is dependent on the relative drive strengths of the transistors making up the SRAM cell. In this context, the term drive strength of a transistor is intended to mean the magnitude of the current flowing through the transistor when the transistor is switched on.

Conventionally designers of SRAM cells have been able to adjust all the major performance metrics of a SRAM cell, such as access time, static noise margin and write margin, by adjusting the transistor widths and lengths in planar CMOS technology to control the drive strengths of the respective transistors. Thus, for example in a SRAM cell implemented in conventional planar bulk CMOS technology the source and drain regions of the pull-down transistor can be made wider than the source and drain regions of the corresponding pass-gate transistor, thus increasing the drive strength of the pull-down transistor relative to the drive strength of the pass-gate transistor. The read time of the cell can therefore be improved.

A typical implementation of the SRAM cell of FIG. 1 in conventional planar CMOS technology showing the differentiation of the transistor dimensions is shown in FIG. 2. In FIG. 2 the same reference numerals as the reference numerals for the corresponding features in FIG. 1 have been used. In addition, interconnection 26 interconnects the gate of pull-up transistor 8; the gate of pull-down transistor 12; the drain of pull-up transistor 6; the drain of pull-down transistor 10 and the internal node side of the pass-gate transistor 14, and thus represents the internal node 18. An interconnection 28 interconnects the gate of pull-up transistor 6; the gate of pull-down transistor 10; the source of the pull-up transistor 8; the drain of pull-down transistor 12 and the internal node side of pass-gate transistor 20, and thus represents the internal node 24. As can be seen, the widths of the pull-down transistors 10, 12 are greater than the widths of the corresponding pass-gate transistors 14, 20, giving the pull-down transistors 10, 12 greater drive strength and thus improving the performance of the SRAM cell. It is noted that the pull-up transistors 6, 8 are P-MOS transistors, while the other transistors are N-MOS transistors.

However, due to increasing variability, it is becoming increasingly difficult to manufacture a SRAM array of several Mbits in planar CMOS technology with an acceptable yield as the density of the integrated circuits is increased. In addition, as the size of the individual MOSFETS is reduced, the performance of the MOSFETS degrades, in particular due to so-called short channel effects. At the present it is expected that conventional planar MOSFETs will reach the limit of miniaturisation by 2010, concurrent with the widespread adoption of 32 nm technologies.

FinFETs have been suggested as potential replacements for conventional planar MOSFETS. The distinguishing characteristic of the finFET is that the conducting channel is wrapped around a thin silicon "fin" which forms the body of the device. One or more gate electrodes are formed adjacent the fin. In a dual-gate device, one gate electrode on each side of the fin is formed. In a tri-ate device, one gate electrode on each side of the fin and one gate electrode at the top of the fin are formed. These arrangements enable good gate control over the channel, resulting in improved short channel immunity and improved ratio between the channel current when the transistor is switched on and the channel current when the transistor is switched off. The structure of a typical finFET will be described with reference to FIGS. 3-5.

FIG. 3 is a plan view of a typical finFET structure. FIG. 4 is a longitudinal cross-section through the line A-A in FIG. 1. FIG. 5 is a perspective view of a typical finFET structure showing the fin and the gate structures. In FIG. 5 the drain region and the source region of the finFET have been omitted for clarity.

The finFET 30 is provided with a narrow and relatively high fin 32 upstanding from the surface of the substrate 34 (seen best in FIGS. 4 and 5). The fin 32 is typically formed from Silicon on a buried Oxide (BOX) layer of a Silicon (SOI) substrate 34 or on a silicon substrate and has a width $W_{fin}$ and a Height $H_{fin}$. One or more gate electrodes 36 having a gate length $L_{gate}$ are disposed over the top and sides of the fin 32 and spaced apart from the fin 32 by a spacer 38. Typical dimensions for the fin 32 and gate electrodes 36 for the 32 nm CMOS node would be $L_{gate}$=20-50 nm; $W_{fin}$=5-20 nm; $H_{fin}$=20-100 nm. Adjacent each end of the fin 32 are formed two high density doped (HDD) regions forming a source HDD region 40 and a drain HDD region 42 of the finFET 30. In addition, typically, low density doped (LDD) extension regions, forming source LDD extension region 44 and drain LDD extension region 46, are formed within the channel extending from the source HDD region 40 and drain HDD region 42 respectively towards the gate electrode(s) 36.

It is known to omit the drain LDD extension region of a finFET in order to reduce Gate Induced Drain leakage (GIDL) current within the channel of a finFET, as for example discussed in the article "GIDL (Gate-Induced Drain Leakage) and Parasitic Schottky barrier Leakage Elimination in aggressively scaled $HfO_2$/TiN FinFET devices" Hoffmann et al, Electron Devices Meeting, 2005 IEDM Technical Digest. IEEE International Dec. 5, 2005, Piscataway, N.J., USA.

Many of the performance metrics of a finFET, for example the drive strength of the finFET, are determined by the effective channel width of a finFET which in turn depends upon the dimensions of the fin. In particular, the effective channel width of a finFET is given by $2 \times H_{fin}$ (for a dual gate FinFET) and $2 \times H_{fin} + W_{fin}$ (for a tri-gate finFET). The person skilled in the art will be familiar with the principles of operation of a Field Effect Transistor (FET) and therefore a detailed description of the operation of the finFET will be omitted.

An exemplary implementation of the SRAM cell of FIG. 1 using finFETs is shown in FIG. 6. In FIG. 6 reference numerals corresponding to reference numerals used in FIG. 2 are used for the corresponding features. As can be seen from a consideration of FIG. 6, in this exemplary silicon layout implementation, the finFET pass-gate transistor 114 shares a common fin with the finFET pull-down transistor 110 and the finFET pass-gate transistor 120 shares a common fin with the finFET pull-down transistor 112. As a result, the drive strengths of the transistors in the SRAM cell implementation shown in FIG. 6, in particular the pass-gate transistors 114, 120 and the pull-down transistors 110,112 cannot easily be altered independently.

Previously several different methods have been suggested to increase the drive strength of a finFET. In a first method disclosed for example in U.S. Pat. No. 6,706,571 an additional fin parallel to the fin common with the pass-gate transistor is provided for each pull-down transistor in a SRAM cell. However, the addition of the extra fin results in an undesirable increase in area used by the SRAM cell. In a second method disclosed for example in H. Kawasaki et al "Embedded Bulk FinFET SRAM cell Technology with planar FET peripheral circuit for hp32 nm node and beyond", Symposium on VLSI Technology digest of Technical papers, 2006, the fin height of adjacent finFETs in a cell built on bulk Si is adjusted to alter the drive strength of the finFETs. However, it is difficult to apply this technique to the mass fabrication of integrated circuits and especially difficult to apply this technique to finFETs built on a SOI substrate. In a third method proposed in Z. Guo et al., "FinFET-based SRAM Design", Proceedings of the 2005 International Symposium on Low Power Electronics and Design (ISPLED'05), pp 2-7, 2005, the pull-down transistors are rotated by 45 degrees so that the channels are formed in the [100] plane, resulting in an improvement in the Signal Noise Margin (SNM) owing to the improved electron mobility in the [100] plane compared with the conventional [110]. However, again this technique is complex and it is difficult to apply this technique to the mass fabrication of integrated circuits.

The present inventors have realised it would be desirable to be able to selectively modify the drive strength of a finFET in a CMOS circuit or to differentiate the drive strengths of two or more finFETs in a CMOS circuit.

SUMMARY

In accordance with one aspect of the present invention, there is provided a method of fabricating a fin Field Effect Transistor (finFET), the finFET being formed on a substrate and comprising a fin formed on the substrate, a first high density doped (HDD) region and a second high density doped (HDD) region formed in the substrate at longitudinal ends of the fin and at least one gate region formed adjacent the fin, the method comprising the steps of: determining whether the finFET should have a maximum drive strength or a relatively lower drive strength; and fabricating the finFET with a first low density doped (LDD) extension region in the substrate extending from the first high density doped (HDD) region toward the gate region and a second low density doped (LDD) extension region in the substrate extending from the second high density doped (HDD) region toward the gate region where a maximum drive strength is determined; and fabricating the finFET without one or both of said LDD extension regions in the substrate when a relatively lower drive strength is determined.

In accordance with another aspect of the invention, there is provided a method of forming a circuit comprising at least a first fin Field Effect Transistor (finFET) and a second finFET, the at least first and second finFETs being formed on a substrate and comprising a fin formed on the substrate, a first high density doped (HDD) region and a second high density doped (HDD) region formed in the substrate at longitudinal ends of the fin and at least one gate region formed adjacent the fin, where the drive strength of the first finFET is selected to be higher than the drive strength of the second finFET, by forming the first finFET with at least one of a first low density doped (LDD) extension region in the substrate extending from the first HDD region toward the gate region and a second low density doped (LDD) extension region in the substrate extending from the second HDD region toward the gate region; and the drive strength of the second finFET is selected to be lower than the drive strength of the first finFET by forming the second finFET with no LDD extension regions in the substrate or with only one of said first LDD extension region or said second LDD extension region.

In accordance with a further aspect of the invention there is provided a circuit comprising at least a first and second fin Field Effect Transistors (finFET), the at least first and second finFETs being formed on a substrate and comprising a fin formed on the substrate, a first high density doped (HDD) region and a second high density doped (HDD) region formed in the substrate at longitudinal ends of the fin and at least one gate region formed adjacent the fin, wherein the first finFET has at least one of a first low density doped (LDD) extension region in the substrate extending from the first HDD region toward the gate region and a second low density doped (LDD) extension region in the substrate extending from the second HDD region toward the gate region; and the second finFET has no LDD extension regions in the substrate or has only one of said first LDD extension region or said second LDD extension region such that the drive strength of the second finFET is reduced relative to the drive strength of the first finFET.

The first FinFET may be selected or determined to have maximum drive strength and be formed with a first LDD extension region and a second LDD extension region in the substrate. The first LDD extension region may be formed in the source region of the finFET and the second LDD extension region may be formed in the drain region of the finFET.

The second FinFET may be selected or determined to have a first drive strength lower than the maximum drive strength and be formed with only a second LDD extension region in the substrate. Alternatively, the second FinFET may be selected or determined to have a second drive strength lower than the maximum drive strength and be formed with a first LDD extension region in the substrate. Further, the second FinFET may be selected or determined to have a minimum drive strength and be formed with no LDD extension regions in the substrate.

In this context it will be understood that the terms "minimum drive strength" and "maximum drive strength", and the "first drive strength" and "second drive strength" intermediate the maximum and minimum drive strengths, are intended to refer to the variation in drive strength of a finFET achievable in accordance with the omission of the source and/or drain LDD extensions in a finFET. It is not necessary that absolute values of the drive strength of the finFET are known: instead it is intended that the drive strength of at least one finFET can be selectively modified relative to either the maximum available drive strength of a finFET having the same dimensions, or relative to another finFET in the circuit.

Advantageously the invention may be applied to finFETs sharing a common fin, such as the pass-gate and pull-down finFETs in a SRAM.

BRIEF DESCRIPTION OF DRAWINGS

Embodiments of the present invention will now be described, by way of example, with reference to the accompanying drawings, in which.

DETAILED DESCRIPTION

In accordance with the invention the drive strength of a FinFET transistor can be selectively modified, and in particular can be selectively reduced, by omitting the LDD extension region formation in the source and/or in the drain of the finFET. One application of this approach is to enable differentiation of the drive strengths of transistors in an integrated circuit by applying the technique to some, but not all, of the transistors in the integrated circuit. In particular in a SRAM cell formed from finFET transistors the application of the technique to the pass-gate transistors, which leads to a reduction of the drive strength of the pass-gate transistors relative to the drive strength of the pull-up and pull-down transistors, results in improved SRAM cell performance.

Figure 3:
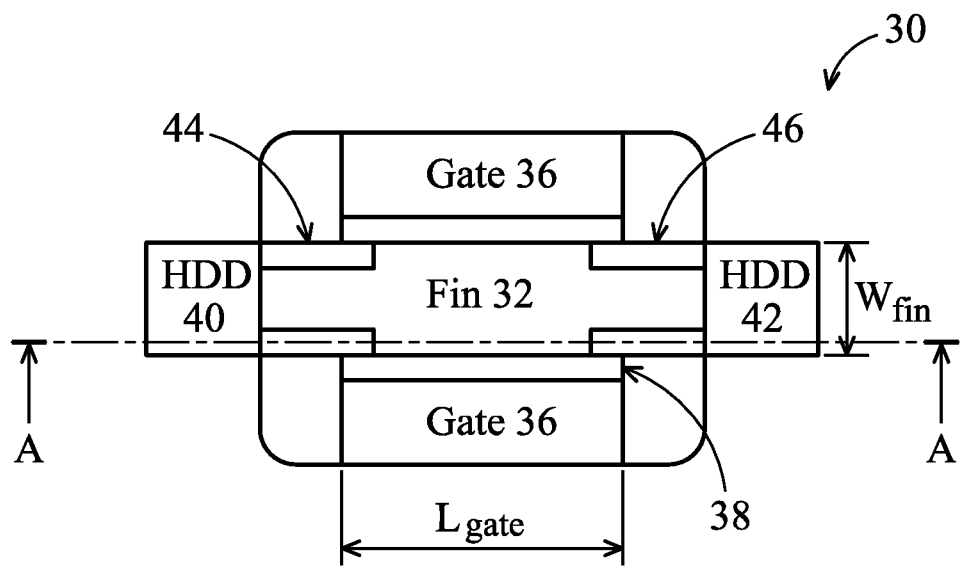
FIG. 3 is a plan view of a typical finFET structure.
Figure 4:
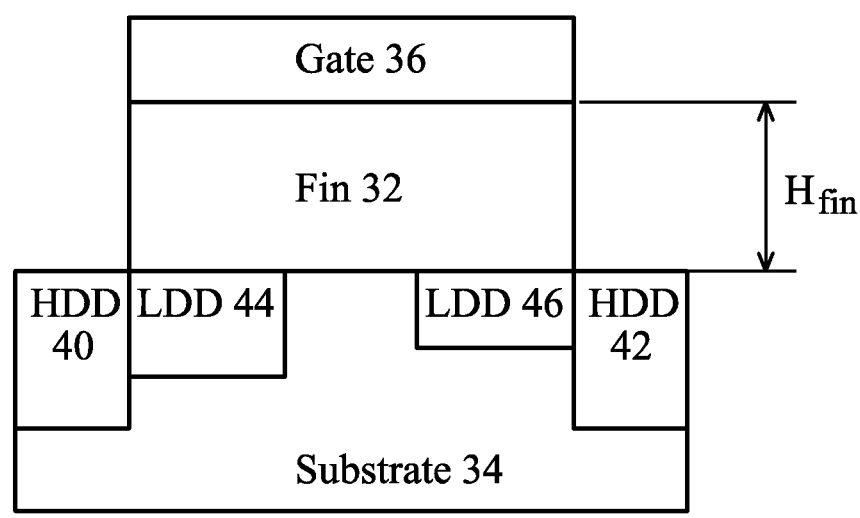
FIG. 4 is a longitudinal cross-section through the line A-A in FIG. 3.
Figure 5:
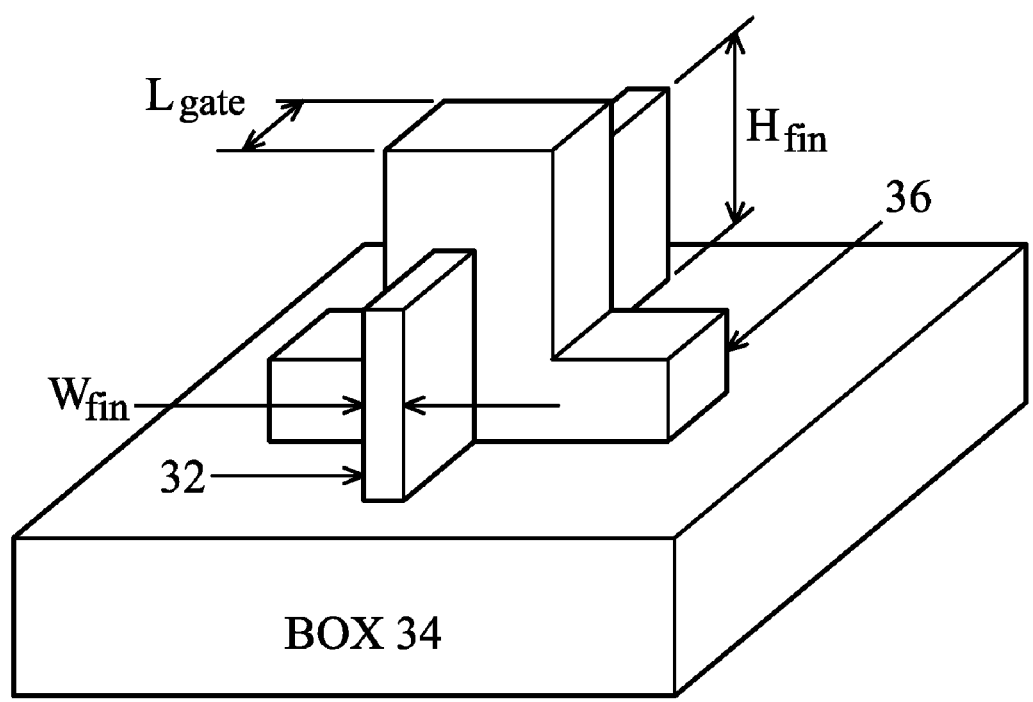
FIG. 5 is a partial perspective view of the typical finFET structure shown in FIGS. 3 and 4.

The invention will now be explained with reference to FIG. 7, which shows a plan view of a finFET structure in accordance with one embodiment of the invention, and FIG. 8, which is a longitudinal cross-section through the line A-A in FIG. 7. Corresponding reference numerals have been used for features corresponding to FIGS. 3 and 4.

In this embodiment of the invention adjacent each end of the fin are formed two high density doped (HDD) regions forming a source HDD region 140 and a drain HDD region 144 of the finFET. The source LDD extension regions 132 have been formed in the channel, extending from the source HDD region 140 towards the gate electrode(s) 136 but drain LDD extension regions have not been formed.

As indicated above, in embodiments of the invention the drain LDD extension regions or the source LDD extension regions or both may be omitted, depending upon the desired extent of the reduction in the drive strength of the transistor required. Typical reductions in the drive strength that may be obtained in an NMOS finFET by omitting the drain LDD extension region, the source LDD extension region and both the source LDD extension region and the drain LDD extension region are shown in FIGS. 9a to 9c respectively.

Figure 9A:
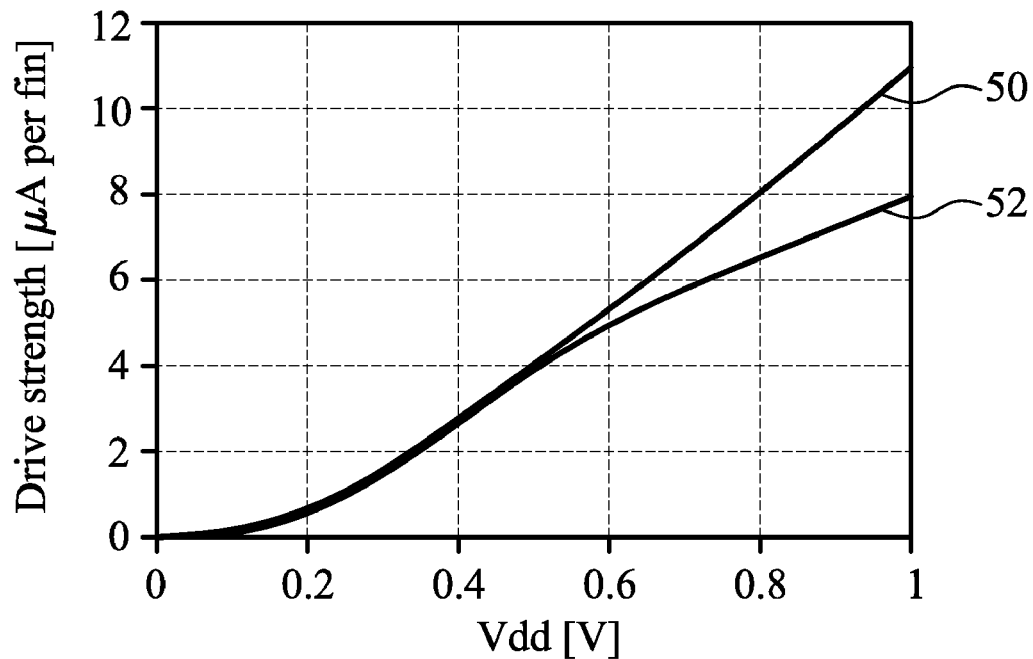
FIGS. 9a) to 9c) show the variation of drive strength of a finFET.
Figure 9B:
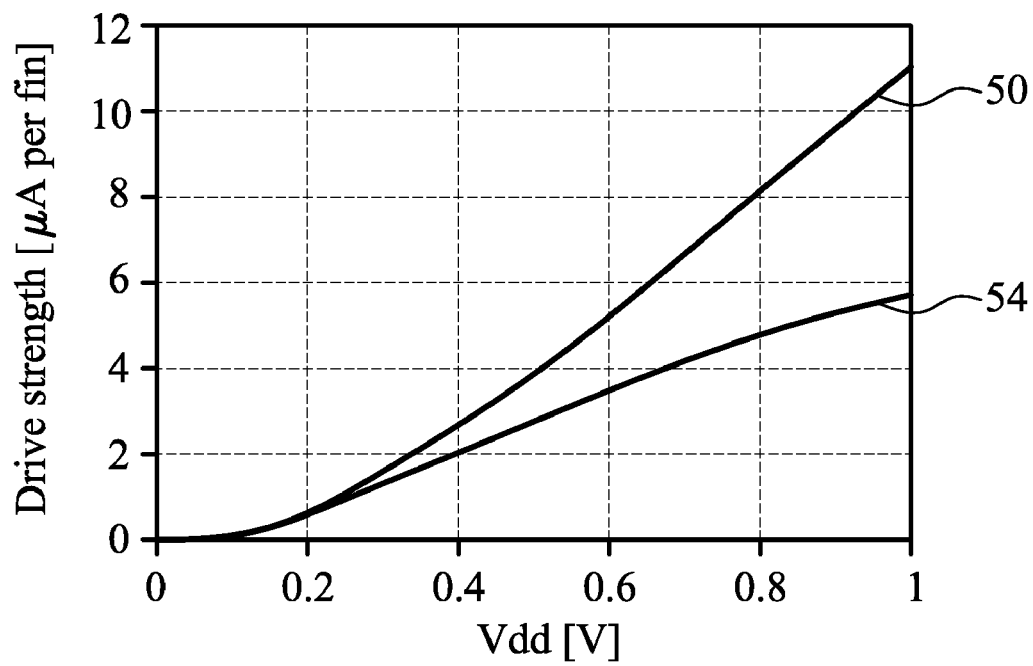
Figure 9C:
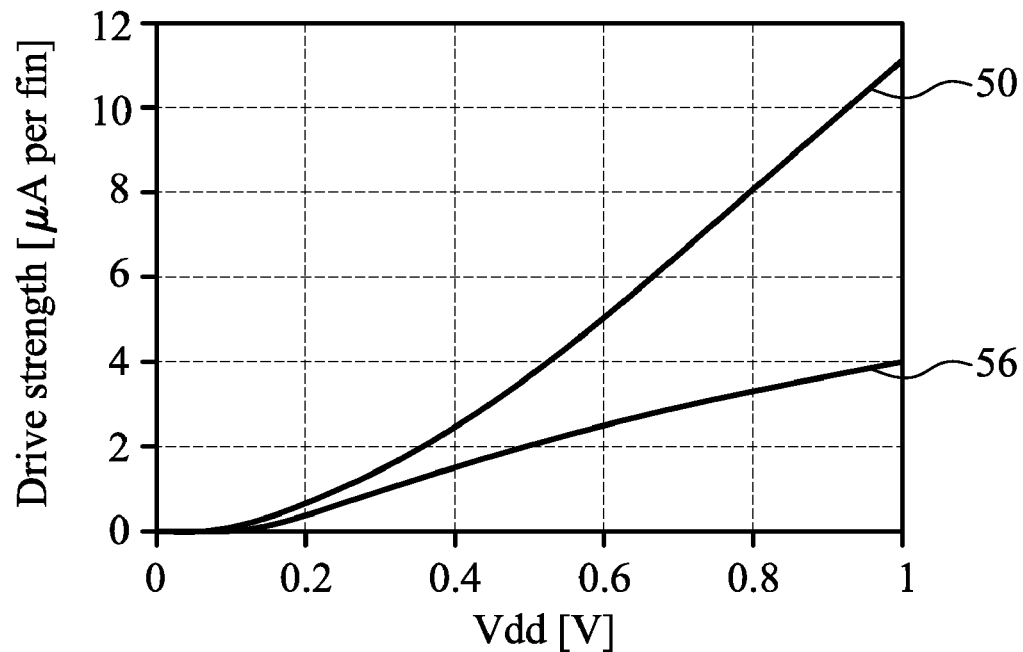

FIGS. 9a to 9c show a plot of the drive strength of a single fin finFET, i.e. the current flowing through the fin of the finFET, against the gate 36 voltage applied to the finFET for a drain to source voltage equal to 1 Volt. In each of FIGS. 9a to 9c the line 50 shows the drive strength of a first finFET having both a source LDD extension region and a drain LDD extension, for example the finFET 30 shown in FIG. 3. Therefore line 50 shows the maximum drive strength that can be obtained without changing the dimensions of the fin.

Figure 7:
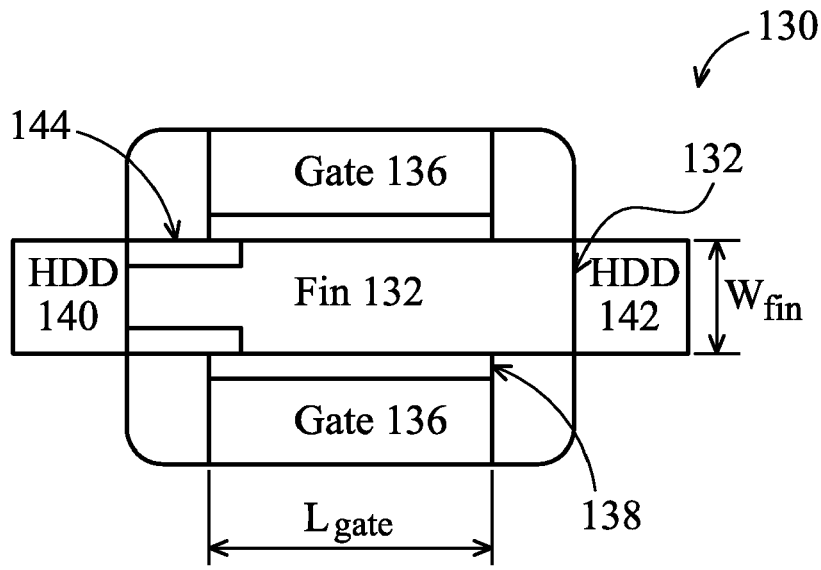
FIG. 7 is a plan view of a finFET structure in accordance with one embodiment of the invention.
Figure 8:
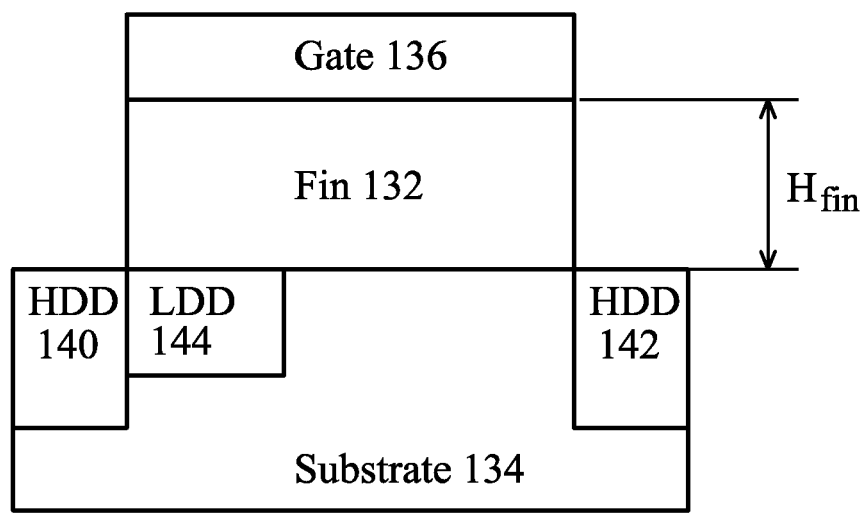
FIG. 8 is a longitudinal cross-section through the line A-A in FIG. 7.

In FIG. 9a the line 52 shows the drive strength of a finFET in accordance with an exemplary embodiment having a source LDD extension region formed therein but no drain LDD extension region formed therein, for example the finFET 130 according to the exemplary embodiment shown in FIGS. 7 and 8. As can be seen, the drive current of the finFET in this embodiment shown by line 52 is reduced with respect to the maximum drive strength shown by line 50 by up to 27%.

In FIG. 9b the line 54 shows the drive strength of a finFET in accordance with an exemplary embodiment having a drain LDD extension region formed therein but no source LDD extension region formed therein (not shown). As can be seen, the drive current of the finFET in this embodiment shown by line 54 is reduced with respect to the maximum drive strength shown by line 50 by up to 47%.

In FIG. 9c the line 56 shows the drive strength of a finFET in accordance with an exemplary embodiment having no source LDD extension region or drain LDD extension region formed therein (not shown). As can be seen, the drive current of the finFET in this embodiment shown by line 56 is reduced with respect to the maximum drive strength shown by line 50 by up to 63%. Line 56 shows the minimum drive strength that can be obtained without changing the dimensions of the fin.

As will be appreciated by a skilled person, the invention may be applied to any situation in which it is desired to selectively modify the drive current of a finFET transistor. Thus it can be determined during a design process whether a finFET should have a maximum drive strength or should have a relatively lower drive strength. The finFET can then be designed, and then fabricated, with or without an LDD extension region for the source and/or the drain, according to the determined relative drive strength.

The invention is particularly suitable where a differentiation between the drive currents of two or more finFET transistors within a circuit is required. In this case, the drive strength of a first finFET of a circuit can be selected to be higher that a second finFET of the circuit, and the second finFET can be formed having fewer LDD extension regions than the first finFET, and thus having a lower drive strength.

One situation in which the invention can be applied is in a SRAM cell, and therefore embodiments of the invention will now be described with reference to a SRAM cell. However a skilled person will appreciate that the invention is not limited to application in a SRAM cell.

In the exemplary embodiment of the invention applied to a SRAM cell, the drive strength of the pass-gate transistors are modified by omitting source LDD extension regions or drain LDD extension regions, in order to reduce the drive strength of the pass-gate transistor. It should be noted that in the pass-gate transistor of an SRAM, the source and drain change role depending on the state of the cell (read/write/standby), therefore we will refer to the bit line side LDD extension regions or the internal node side LDD extension regions for the pass-gate transistors instead of source and drain LDD extension regions. However, the skilled person will understand that the principles of omitting one or both of the LDD extension regions on the finFET may be applied equally to this situation.

The static noise margin is given by the drive strength ratio of the pass-gate and the pull-down transistors. In the exemplary embodiment of the invention applied to a SRAM cell, the modification of the drive strength of the pass-gate transistors by omitting the bit line side LDD extension regions or the internal node side LDD extension regions as described above and as shown in FIGS. 9a) to 9c) will improve the static noise margin of the cell.

Figure 10:
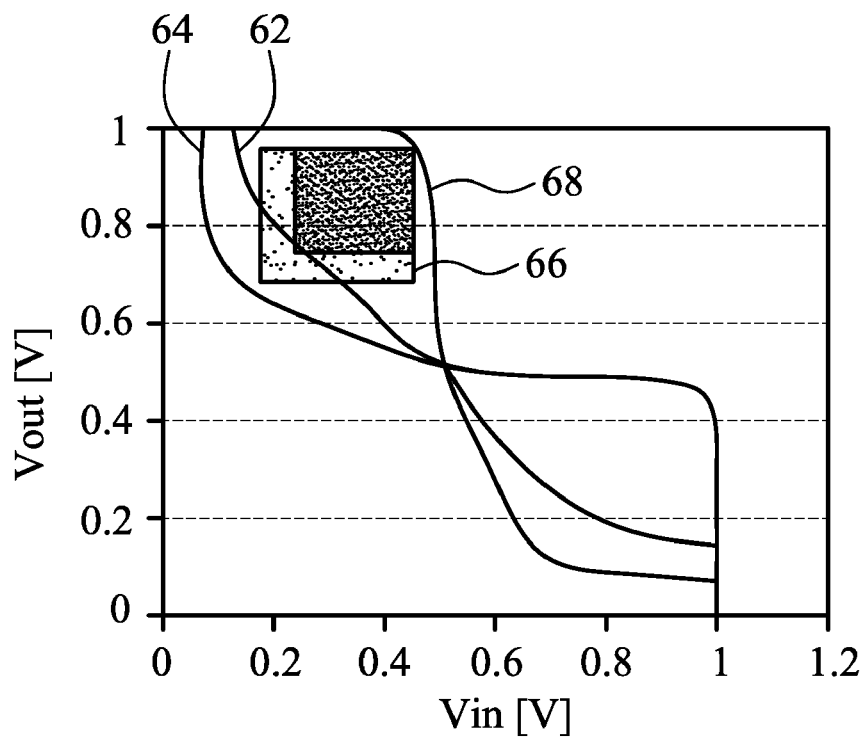
FIG. 10 compares simulated butterfly curves of a prior art SRAM cell and a SRAM cell implementing the present invention.

The static noise margin can be illustrated by means of a SRAM cell butterfly curve. FIG. 10 shows simulated butterfly curves of a first cell with internal node LDD extension regions in the pass-gate transistors (line 62) and a second cell without internal node LDD extension regions in the pass-gate transistors (line 64). Each cell has the same pull-up, pull-down and pass-gate transistor dimensions ($L_{gate}$=50 nm; $W_{fin}$=10 nm, $H_{fin}$=60 nm). $V_{dd}$ is equal to 1.

The Static Noise Margin can be represented visually by the size of the biggest square that can be inserted in the "eyes" of the butterfly curve. As is clear from FIG. 10, the static noise margin of the second cell, represented by square 66, is larger than the static noise margin of the first cell, represented by square 68.

Thus it will be apparent to a skilled person that if the drive strength of the pass-gate transistor is designed to be weaker than the drive strength of the pull-down transistor by application of the principles of the invention, the read operation of a SRAM cell will be easier and the static noise margin will increase. A skilled person can select whether or not bit line side LDD extension regions and/or the internal node side LDD extension regions for the pass-gate transistors are implanted in order to achieve the desired drive strength decrease required for the pass gate transistor. In this context it should be noted that the drive strength of the pass-gate transistor should not be made too weak. In particular, a weak pass-gate finFET drive strength will also result firstly in a degraded write margin, since the write margin is reduced if the pass gate transistor drive strength decreases with respect to the pull-up transistor, and secondly in reduced read current $I_{read}$, since the read current $I_{read}$ is improved if the drive strength of both pass-gate transistor and pull-down transistor is increased.

As indicated above, the present invention is not limited to use in finFET SRAM cells, and may be applied to a wide variety of circuits using finFETs.

An exemplary finFET CMOS process flow will now be described with reference to FIGS. 11 and 12.

Figure 6:
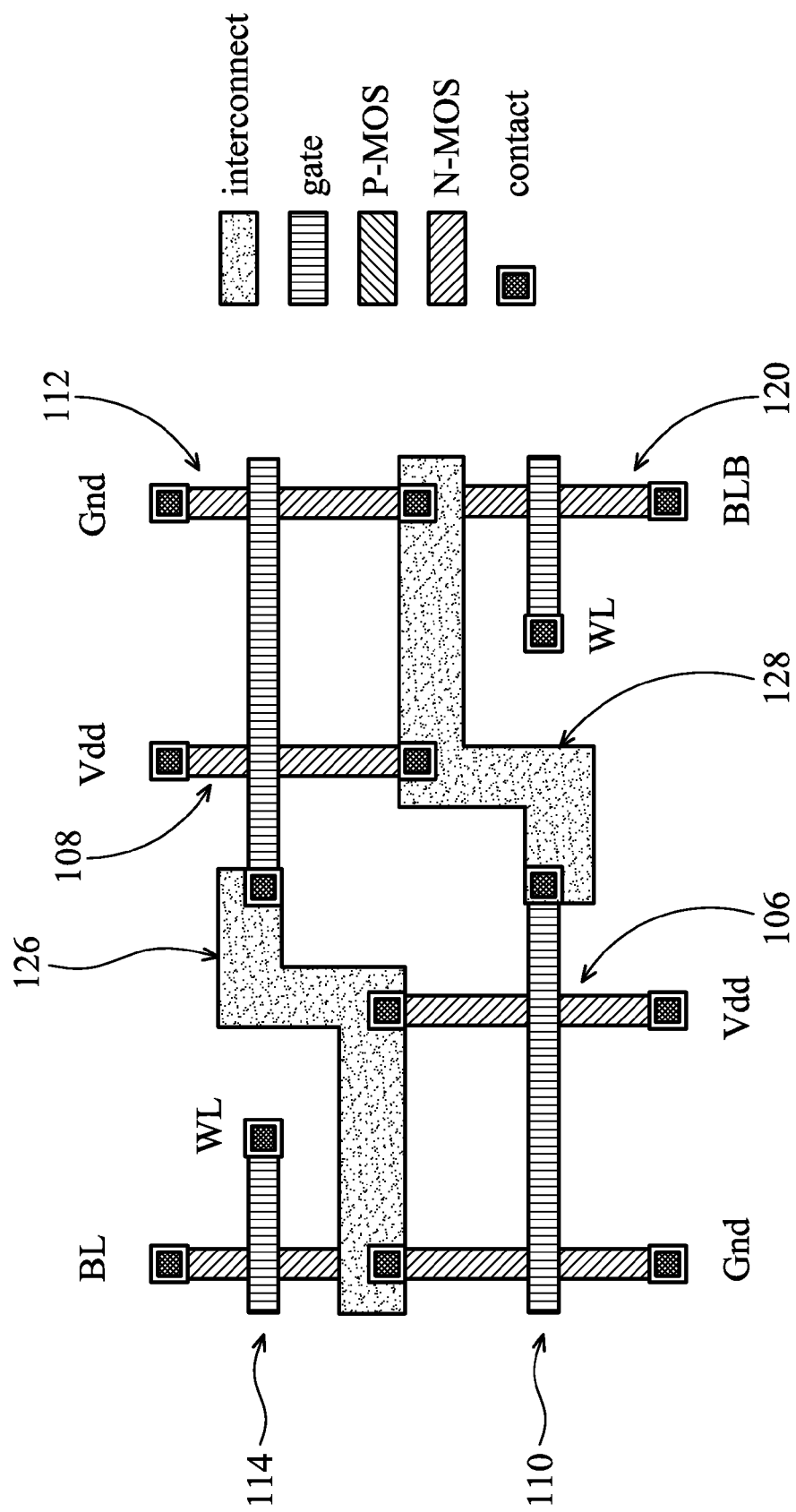
FIG. 6 illustrates an exemplary implementation of the circuit of FIG. 1 using finFETS.
Figure 11:
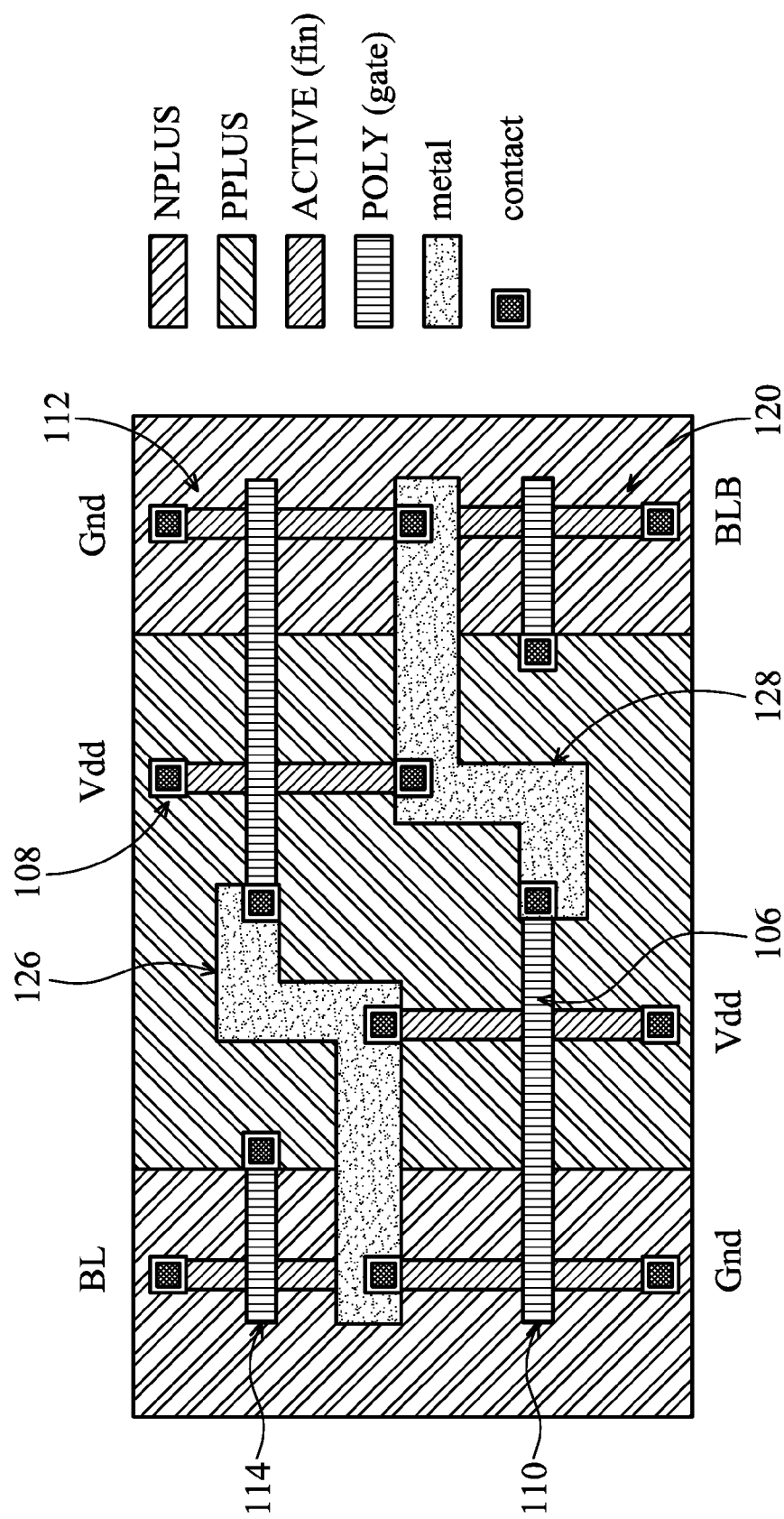
FIG. 11 shows masks showing doping layer areas up to the first metal layer (M1) overlaid on a typical 6-T SRAM layout as shown in FIG. 6.
Figure 12:
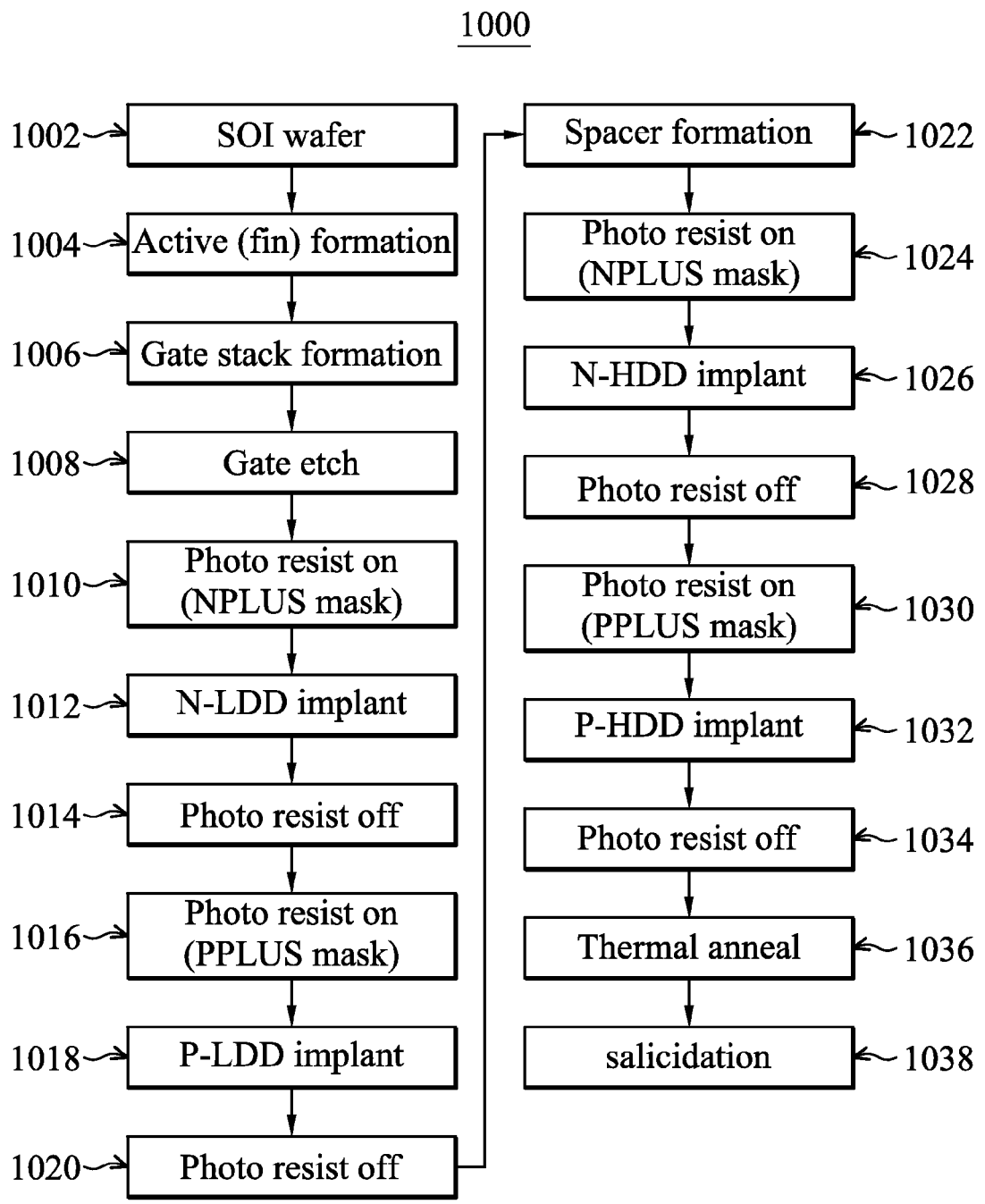
FIG. 12 illustrates the essential steps in a typical FinFET CMOS process flow using the masks shown in FIG. 11

FIG. 11 shows masks showing doping layer areas up to the first metal layer (Ml) overlaid on a typical 6-T SRAM layout as shown in FIG. 6, and FIG. 12 illustrates the essential steps in a typical finFET CMOS process flow using the masks shown in FIG. 11.

The person skilled in the art will appreciate that additional or alternative steps can also be used to effect fabrication of a CMOS circuit and such additional or alternative steps have accordingly not been discussed in detail. In particular, well and halo (pocket) implantation steps are not present in the illustrated process flow, nor are intermediate thermal anneal steps and epitaxial growth steps after spacer formation to form a raised source or drain. Typically fins are undoped so that well implantations are not necessary: however they can be added as additional mask layers.

FIG. 11 shows the mask layers used in the CMOS process flow shown in FIG. 12. Mask layer ACTIVE 70, defines the fins; mask layer POLY 72, defines the gate stack; mask layer NPLUS 74 defines the areas to be N-doped; mask layer PPLUS 76 defines the areas to be P-doped; mask layer METAL 78 defines areas of metal interconnect; and mask layer CONTACT 80 defines contact areas. It should be noted that the mask layers ACTIVE 70, POLY 72, METAL 78 and CONTACT 80 shown in FIG. 11 are positive masks, i.e. the features remain where the mask is drawn. In contrast the NPLUS 74 and PPLUS 76 masks are negative, i.e. photo resist is removed where the mask is drawn such that underlying areas are open for the formation of doped layers, for example by ion implantation.

In the exemplary finFET CMOS process flow 1000 shown in FIG. 12, firstly a SOI silicon substrate is taken 1002, and the fins are formed 1004 using the ACTIVE mask 70. The fins are typically formed from silicon. Thereafter the associated gate stacks are formed 1006 on the substrate using the POLY mask 72, and a final gate etch step carried out 1008.

Then the LDD extensions are formed. Firstly the NPLUS mask, as shown in FIG. 11, is used in step 1010 to apply photo resist patterned to form the N-doped LDD extension regions, and then the N-LDD implant step 1012 is carried out. The N-LDD implant step 1012 may use, for example, Phosphorous (P) or arsenic (A) dopants. The photo resist is removed 1014. Next the PPLUS mask, as shown in FIG. 11, is used in step 1016 to apply photo resist patterned to form the P-doped LDD extension regions, and then P-LDD implant step is carried out 1018. The P-LDD implant step may use, for example, Boron (B) or Boron Fluorine ($BF_2$). Then again the photo resist is removed 1020.

After formation of a spacer 1022, the HDD extension regions are formed. Firstly the NPLUS mask, as shown in FIG. 11, is used in step 1024 to apply photo resist patterned to form the N-doped HDD regions. Then the N-HDD implant step 1026, which may be for example use Phosphorous (P) or arsenic (A), is carried out. The photo resist is removed, in step 1028. Then the PPLUS mask, as shown in FIG. 11, is used to apply photo resist patterned to form the P-doped HDD regions in step 1030. Then the P-HDD implant step 1032 is carried out. The N-HDD implant step 1032 may use, for example, Boron (B) or Boron Fluorine ($BF_2$). Once again the photo resist is removed in step 1034. A thermal anneal process in step 1036 completes the step of forming the LDD and HDD areas. Finally a salicidation step 1038 is carried out before the end of the process.

Modifications of the finFET process flow and/or process masks to fabricate a SRAM cell in accordance with exemplary embodiments of the invention will now be described with reference to FIGS. 13-16.

In a first embodiment illustrated with reference to FIGS. 13 and 14 a finFET transistor having asymmetric LDD extension regions, as described above with reference to FIGS. 7 and 8 is formed as a pass-gate transistor in a SRAM cell. As illustrated, the pass-gate transistors only have a LDD extension region on one side of the gate, in this case only the internal node side LDD extension regions are present and the bit line side LDD extension regions are omitted.

Figure 13:
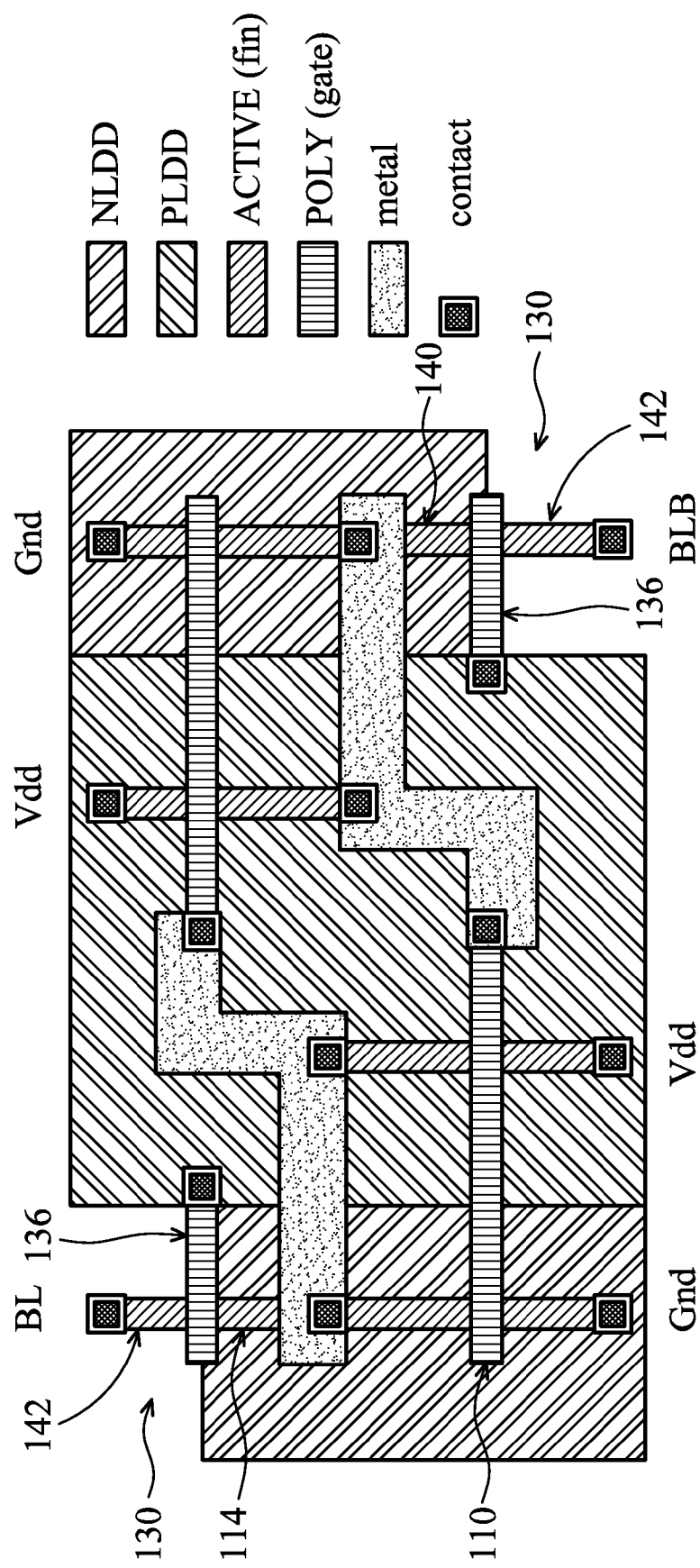
FIG. 13 shows masks showing doping layer areas up to the first metal layer (M1) overlaid on a typical 6-T SRAM layout as shown in FIG. 6.

FIG. 13 shows masks showing doping layer areas up to the first metal layer (Ml) overlaid on a typical 6-T SRAM layout. Reference numerals corresponding to reference numerals in FIGS. 7 and 8 have been added to FIG. 13. FIG. 14 illustrates the essential steps in a FinFET CMOS process flow 2000 using the masks shown in FIG. 13.

Again, the person skilled in the art will appreciate that additional or alternative steps can also be used to effect fabrication of a CMOS circuit and such additional or alternative steps have accordingly not been discussed in detail. In particular, well and halo (pocket) implantation steps are not present in the illustrated process flow, nor are intermediate thermal anneal steps and epitaxial growth steps after spacer formation to form a raised source or drain. Typically fins are undoped so that well implantations are not necessary: however they can be added as additional mask layers.

The LDD extension regions are typically formed by ion implantation of impurities, either vertically or under a tilt angle. Alternatively doping techniques such as plasma doping (PLAD) can also be applied. Also co-implantations with non-dopant impurities, e.g. Germanium (Ge) or Fluorine (F) or Hydrogen (H) or helium (He), may be made.

Figure 14:
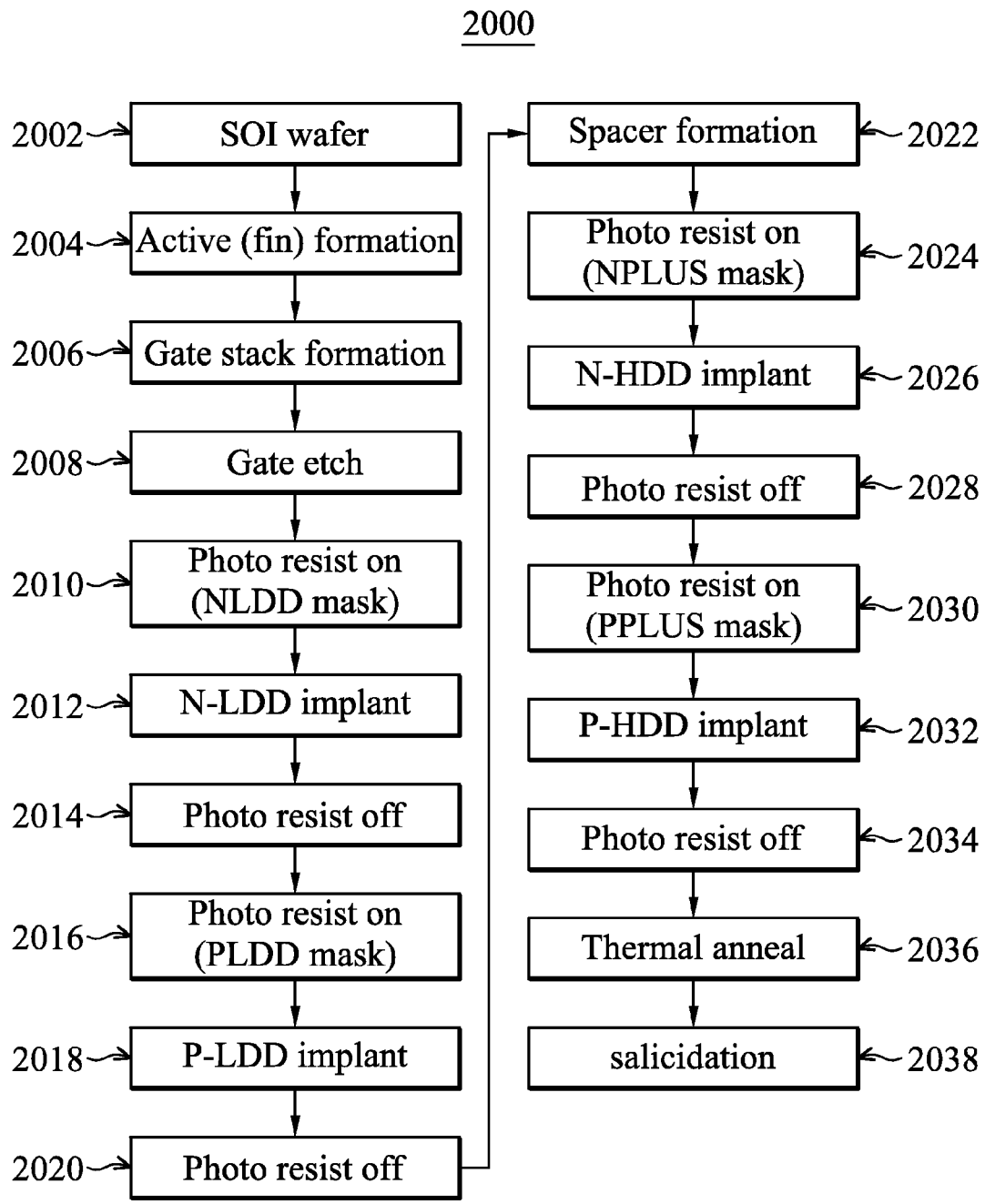
FIG. 14 illustrates the essential steps in a typical FinFET CMOS process flow using the masks shown in FIG. 13

FIG. 13 shows the mask layers used in the CMOS process flow shown in FIG. 14. Mask layer ACTIVE 70, defines the fins; mask layer POLY 72, defines the gate stack; mask layer METAL 78 defines areas of metal interconnect; and mask layer CONTACT 80 defines contact areas correspond with the same mask layers described above with reference to FIG. 11, and have therefore been given the same reference numerals.

New mask layer NLDD 82 defines the areas to be N-doped; and new mask layer PLDD 84 defines the areas to be P-doped.

Again it should be noted that the mask layers ACTIVE 70, POLY 72, METAL 78 and CONTACT 80 shown in FIG. 13 are positive masks, i.e. the features remain where the mask is drawn. In contrast the NLDD 82 and PLDD 84 masks are negative, i.e. photo resist is removed where the mask is drawn such that underlying areas are open for the formation of doped layers, for example by ion implantation.

In the finFET CMOS process flow 2000 in accordance with the embodiment of the invention shown in FIG. 14, firstly a SOI silicon substrate is taken 2002, and the fins are formed 2004 using the ACTIVE mask 70. The fins are typically formed from silicon. Thereafter the associated gate stacks are formed 2006 on the substrate using the POLY mask 72, and a final gate etch step carried out 2008.

Then the LDD extension regions are formed. Firstly the NLDD mask 82, as shown in FIG. 13, is used in step 2010 to apply photo resist patterned to form the N-doped LDD extension regions, and then the N-LDD implant step 2012 is carried out. The N-LDD implant step 2012 may use, for example, Phosphorous (P) or arsenic (A) dopants. The photo resist is removed in step 2014. Next the PLDD mask 84, as shown in FIG. 13, is used in step 2016 to apply photo resist patterned to form the P-doped LDD extension regions, and then P-LDD implant step is carried out 2018. The P-LDD implant step may use, for example, Boron (B) or Boron Fluorine ($BF_2$). Then again the photo resist is removed 2020.

After formation of a spacer 2022, the HDD regions are formed. Firstly the NPLUS mask 74, as shown in FIG. 11, is used in step 2024 to apply photo resist patterned to form the N-doped HDD regions. Then the N-HDD implant step 2026, which may be for example use Phosphorous (P) or arsenic (A), is carried out. The photo resist is removed, in step 2028. Then the PPLUS mask 76, as shown in FIG. 11, is used to apply photo resist patterned to form the P-doped HDD regions in step 2030. Then the P-HDD implant step 2032 is carried out. The N-HDD implant step 2032 may use, for example, Boron (B) or Boron Fluorine ($BF_2$). Once again the photo resist is removed in step 2034. A thermal anneal process in step 2036 completes the step of forming the LDD and HDD areas. Finally a salicidation step 2038 is carried out before the end of the process.

As will be apparent from the above description, in the embodiment of the invention described with reference to FIGS. 13 and 14 two additional masks NLDD 82 and PLDD 84 are needed in addition to the masks shown in FIG. 11, but no additional process steps are required. The new masks NLDD 82 and PLDD 84 do not contain small features, and are therefore relatively inexpensive.

In a second embodiment illustrated with reference to FIGS. 15 and 16 a finFET transistor having asymmetric LDD extension regions, as described above with reference to FIGS. 7 and 8, is formed as a pass-gate transistor in a SRAM cell. As illustrated the pass-gate transistors only have a LDD extension on one side of the gate, in this case only the internal node side LDD extensions are present and the bit line side LDD extensions are omitted.

Figure 15:
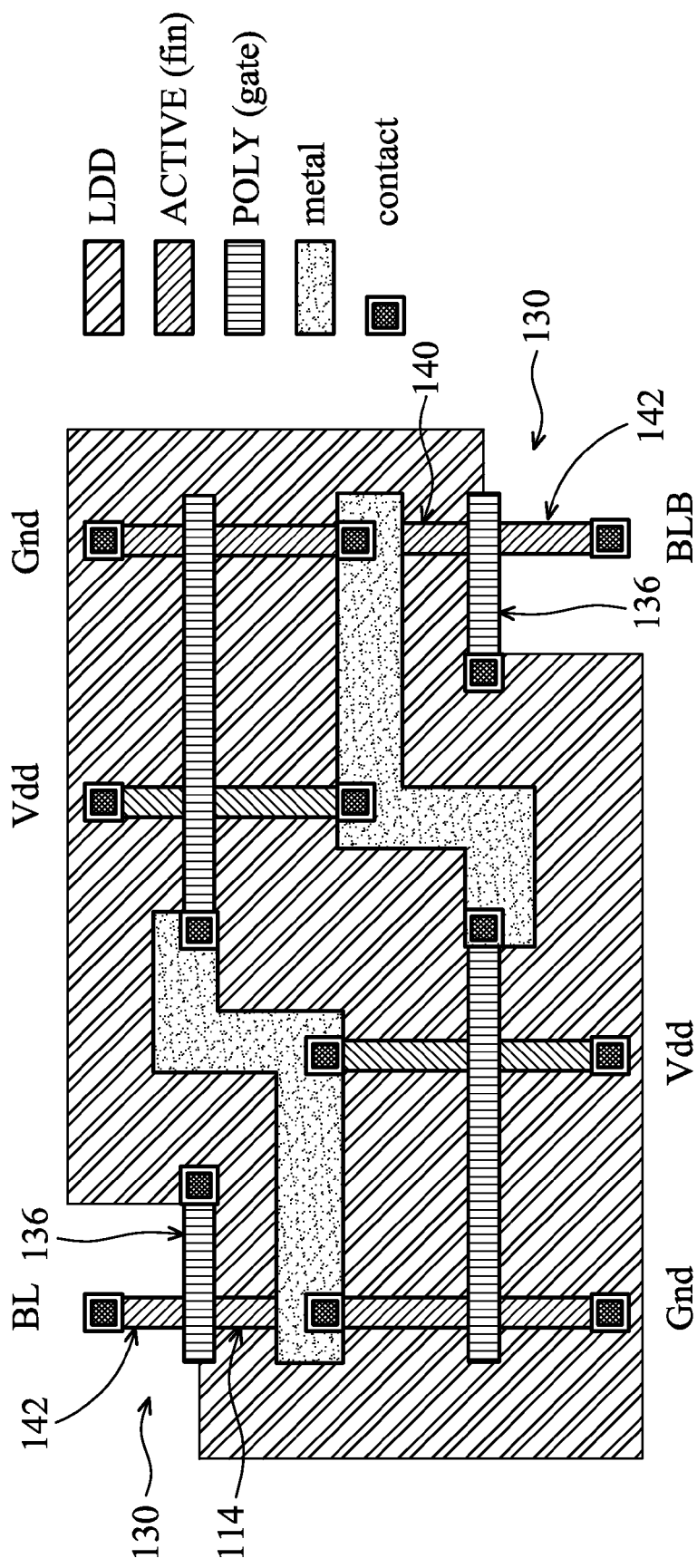
FIG. 15 shows masks showing doping layer areas up to the first metal layer (M1) overlaid on a typical 6-T SRAM layout as shown in FIG. 6.
Figure 16:
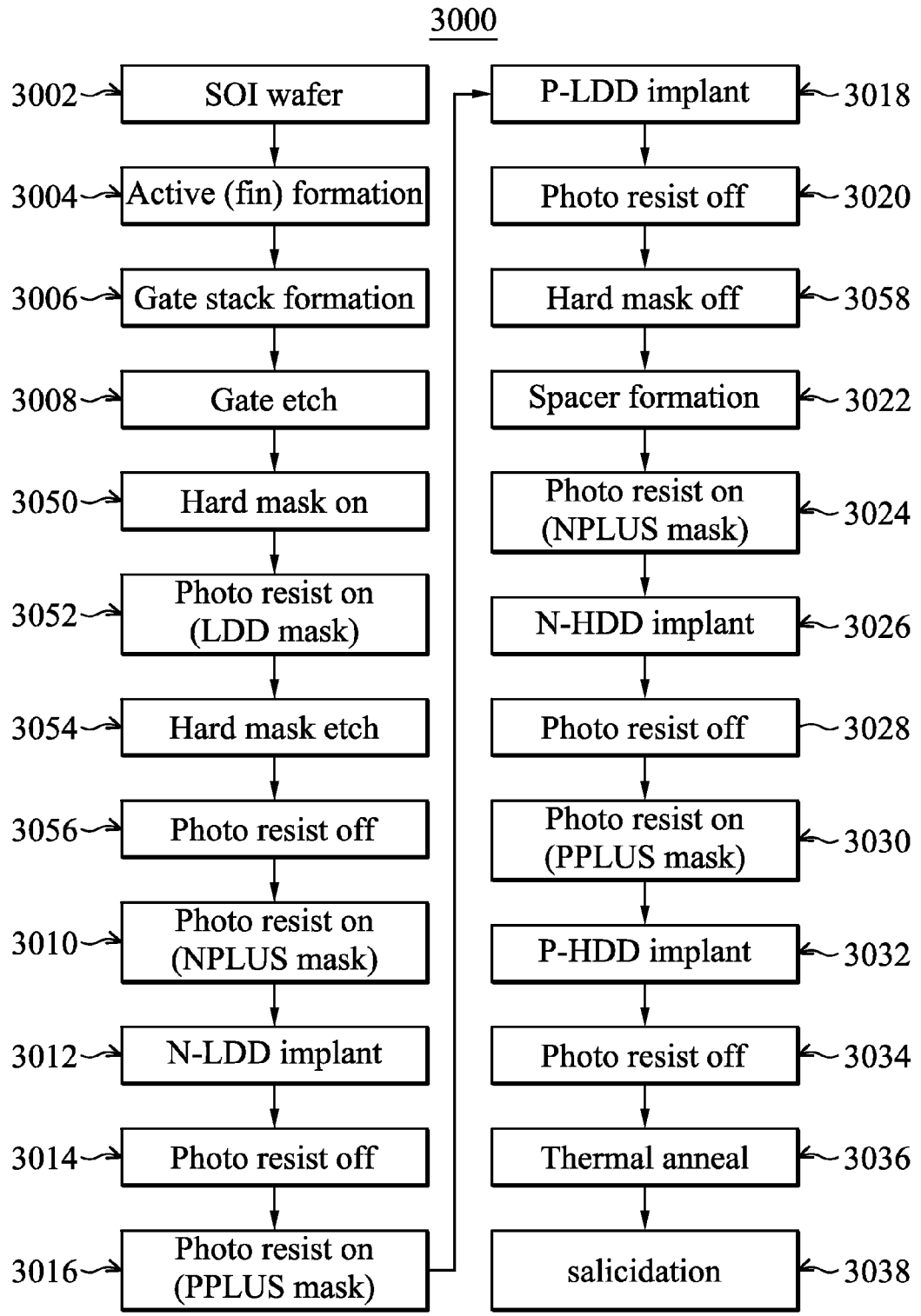
FIG. 16 illustrates the essential steps in a typical FinFET CMOS process flow using the masks shown in FIG. 15.

FIG. 15 shows a hard mask to be used in addition to the masks shown in FIG. 11 in the FinFET CMOS process flow 3000 shown in FIG. 16. Reference numerals corresponding to reference numerals in FIGS. 7 and 8 have been added to FIG. 15.

Again, the person skilled in the art will appreciate that additional or alternative steps can also be used to effect fabrication of a CMOS circuit and such additional or alternative steps have accordingly not been discussed in detail. In particular, well and halo (pocket) implantation steps are not present in the illustrated process flow, nor are intermediate thermal anneal steps and epitaxial growth steps after spacer formation to form a raised source or drain. Typically fins are undoped so that well implantations are not necessary: however they can be added as additional mask layers.

The LDD extension regions are typically formed by ion implantation of impurities, either vertically or under a tilt angle. Alternatively doping techniques such as plasma doping (PLAD) can also be applied. Also co-implantations with non-dopant impurities, e.g. Germanium (Ge) or Fluorine (F) or Hydrogen (H) or helium (He), may be made.

Figure 1:
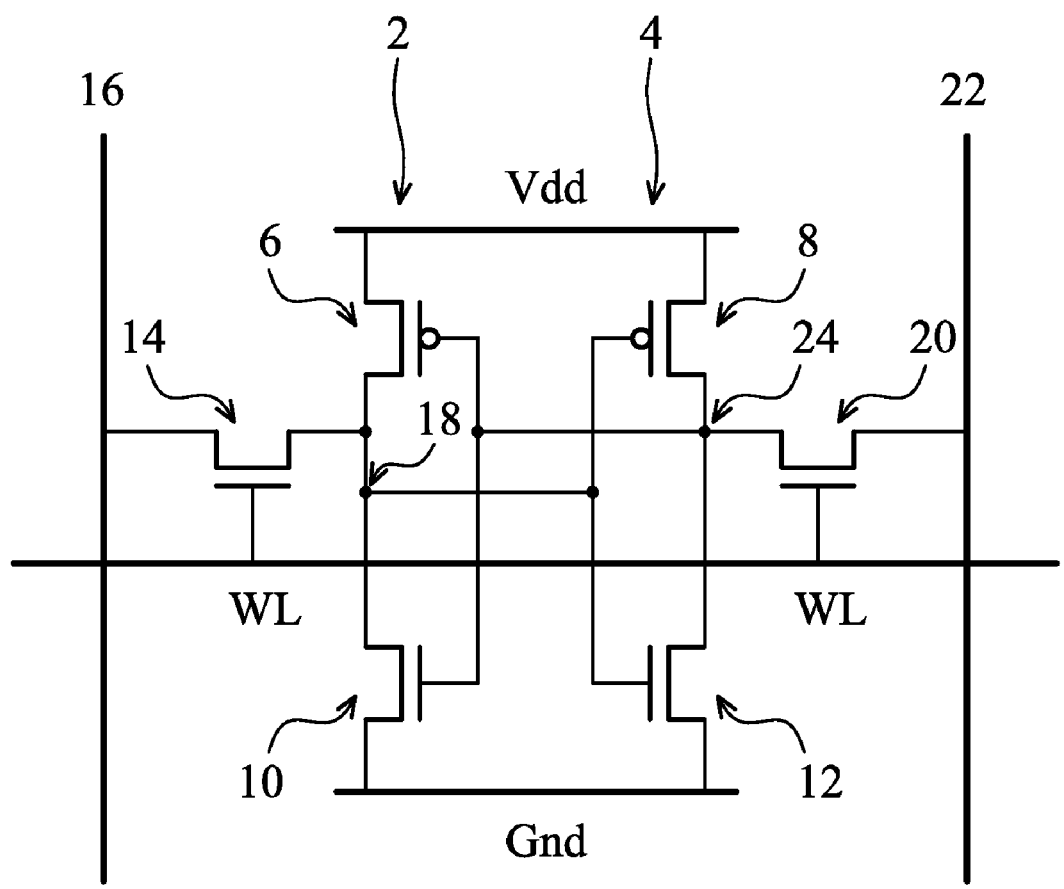
FIG. 1 is a schematic drawing showing a typical SRAM cell circuit with 6 transistors (6-T SRAM cell)
Figure 2:
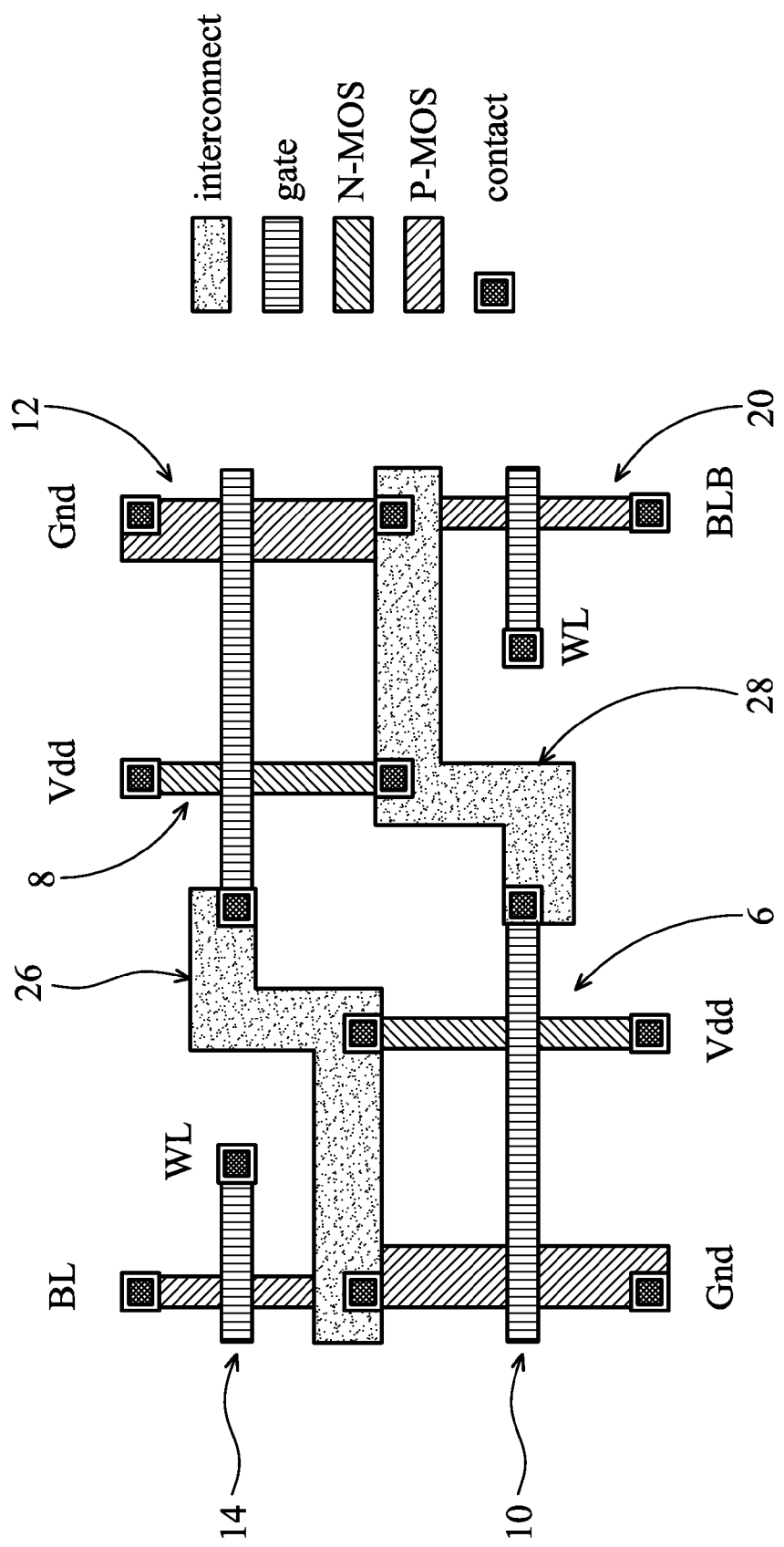
FIG. 2 illustrates a typical implementation of the circuit shown in FIG. 1 in conventional planar CMOS technology.

FIG. 15 shows a blocking hard mask LDD 86. The LDD mask 86 is a negative mask, so that where the mask is drawn the hard mask will be removed and the LDD extension regions formed. In addition masks shown in FIG. 11 are also used in the CMOS process flow shown in FIG. 1. Process steps corresponding to the CMOS process described above with reference to FIG. 12 or 14 will be given corresponding reference numerals.

In the finFET CMOS process flow 3000 in accordance with the embodiment of the invention shown in FIG. 16, firstly a SOI silicon substrate is taken 3002, and the fins are formed 3004 using the ACTIVE mask 70. The fins are typically formed from silicon. Thereafter the associated gate stacks are formed 3006 on the substrate using the POLY mask 72, and a final gate etch step carried out 3008.

In this CMOS process flow, firstly a hard mask layer is applied in step 3050. The hard mask may be, for example, Silicon Nitride $Si_3N_4$ or a TEOS layer or stack of layers. Next the LDD mask 86 is used in step 3052 to apply photo resist, and then the hard mask layer is etched in step 3054. Thereafter the photo resist is removed in step 3056. These steps result in a covering of hard mask preventing formation of LDD extension regions on the bit line side of the pass-gate transistors.

Then the LDD extension regions are formed. Firstly the NPLUS mask 74 is used in step 3010 to apply photo resist patterned to form the N-doped LDD extension regions, and then the N-LDD implant step 3012 is carried out. The N-LDD implant step 3012 may use, for example, Phosphorous (P) or arsenic (A) dopants. The photo resist is removed in step 3014. Next the PPLUS mask 76 is used in step 3016 to apply photo resist patterned to form the P-doped LDD extension regions, and then P-LDD implant step is carried out 3018. The P-LDD implant step may use, for example, Boron (B) or Boron Fluorine ($BF_2$). Then again the photo resist is removed in step 3020, and the hard mask removed in step 3058.

After formation of a spacer 3022, the HDD regions are formed. Firstly the NPLUS mask 74, as shown in FIG. 11, is used in step 3024 to apply photo resist patterned to form the N-doped HDD regions. Then the N-HDD implant step 3026, which may be for example use Phosphorous (P) or arsenic (A), is carried out. The photo resist is removed, in step 3028. Then the PPLUS mask 76, as shown in FIG. 11, is used to apply photo resist patterned to form the P-doped HDD regions in step 3030. Then the P-HDD implant step 3032 is carried out. The N-HDD implant step 3032 may use, for example, Boron (B) or Boron Fluorine ($BF_2$). Once again the photo resist is removed in step 3034. A thermal anneal process in step 3036 completes the step of forming the LDD and HDD areas. Finally a salicidation step 3038 is carried out before the end of the process.

As will be apparent from the above description, in the embodiment of the invention described with reference to FIGS. 15 and 16 only one additional mask namely the LDD mask 86 is needed in addition to the masks shown in FIG. 11, but additional process steps 3050-3058 are required. The new LDD mask 86 does not contain small features, and is therefore relatively inexpensive.

Thus in the embodiments of the invention described with reference to FIGS. 13-16 the LDD extension region is formed in the pass gate transistors only on the side in contact with the internal node. Clearly, in a first alternative the LDD extension region of the pass gate transistors on the side in contact with the bit line may be formed and the LDD extension region on the side in contact with the internal node may be omitted or in a second alternative both the LDD extension regions of the pass gate transistors on the side in contact with the bit line and on the side in contact with the internal node, may be omitted using suitable masks, depending on the required reduction in the drive strength of the transistor.

The skilled person will appreciate that the process flows described herein and the illustrated masks are illustrative only and changes may be made thereto without departing from the scope of the invention. In addition other methods of forming a finFET transistor without one or more LDD extensions are intended to be included within the scope of the invention.

Thus there is provided a method for the selective modification of the drive strength of a FinFET transistor, and in particular a method in which the drive strength of a finFET transistor can be selectively reduced, by omitting an LDD extension region formation in the source and/or in the drain of the FinFET.

One application of this method is to enable differentiation of the drive strengths of transistors in an integrated circuit by applying the technique to some, but not all, of the transistors in the integrated circuit. In particular in a SRAM cell formed from FinFET transistors the application of the technique to the pass-gate transistors, which leads to a reduction of the drive strength of the pass-gate transistors relative to the drive strength of the pull-up and pull-down transistors, results in improved SRAM cell performance.

The invention claimed is:

1. A method of forming a circuit comprising at least a first fin Field Effect Transistor (finFET) and a second finFET, the at least first and second finFETs being formed on a substrate and comprising a fin formed on the substrate, a first high density doped (HDD) region and a second high density doped (HDD) region formed in the substrate at longitudinal ends of the fin and at least one gate region formed adjacent the fin, where the drive strength of the first finFET is selected to be higher than the drive strength of the second finFET, by forming the first finFET with at least one of a first low density doped (LDD) extension region in the substrate extending from the first HDD region toward the gate region and a second low density doped (LDD) extension region in the substrate extending from the second HDD region toward the gate region; and the drive strength of the second finFET is selected to be lower than the drive strength of the first finFET by forming the second finFET with no LDD extension regions in the substrate or with only one of the first LDD extension region or the second LDD extension region.

2. The method of forming a circuit as claimed in claim 1 wherein the first FinFET is selected to have a maximum drive strength and is formed with the first LDD extension region in the substrate and the second LDD extension region in the substrate.

3. The method of forming a circuit as claimed in claim 2 wherein the second FinFET is selected to have a first drive strength lower than the maximum drive strength and is formed with only the second LDD extension region in the substrate.

4. The method of forming a circuit as claimed in claim 2 wherein the second FinFET is selected to have a second drive strength lower than the maximum drive strength and is formed with only the first LDD extension region in the substrate.

5. The method of forming a circuit as claimed in claim 1 wherein the second FinFET is selected to have a minimum drive strength and is formed with no LDD extension regions in the substrate.

6. The method of forming a circuit as claimed in claim 1 wherein the first and second finFETs are formed with a common fin.

7. The method of forming a circuit as claimed in claim 1 where the second finFET forms a pass-gate transistor within a memory cell.

8. The method of forming a circuit as claimed in claim 1 wherein a mask used to define areas in which the LDD extension regions are formed during fabrication of the circuit exclude source and/or drain regions and/or bit line side and/or internal node side of the second FinFET from formation of LDD extension regions.

9. A circuit comprising at least a first and second fin Field Effect Transistors (finFET), the at least first and second finFETs being formed on a substrate and comprising a fin formed on the substrate, a first high density doped (HDD) region and a second high density doped (HDD) region formed in the substrate at longitudinal ends of the fin and at least one gate region formed adjacent the fin, wherein the first finFET has at least one of a first low density doped (LDD) extension region in the substrate extending from the first HDD region toward the gate region and a second low density doped (LDD) extension region in the substrate extending from the second HDD region toward the gate region; and the second finFET has no LDD extension regions in the substrate or has only one of the first LDD extension region or the second LDD extension region is such that the drive strength of the second finFET is reduced relative to the drive strength of the first finFET.

10. The circuit as claimed in claim 9 wherein the first finFET has a maximum drive strength and is formed with the first LDD extension region in the substrate and the second LDD extension region in the substrate.

11. The circuit as claimed in claim 10 wherein the second finFET has a first drive strength lower than the maximum drive strength and is formed with only the second LDD extension region in the substrate.

12. The circuit as claimed in claim 10 wherein the second finFET has a second drive strength lower than the maximum drive strength and is formed with only the first LDD extension region in the substrate.

13. The circuit as claimed in claim 9 wherein the second FinFET has a minimum drive strength and is formed with no LDD extension regions in the substrate.

14. The circuit as claimed in claim 9, wherein the first and second finFETs share a common fin.

15. The circuit as claimed in claim 9, where the second finFET is a pass gate transistor within a memory cell.

16. The circuit as claimed in claim 15, wherein the memory cell includes a Static Random Access Memory (SRAM) cell.

* * * * *